United States Patent
Cheng et al.

(10) Patent No.: US 9,991,385 B2
(45) Date of Patent: Jun. 5, 2018

(54) ENHANCED VOLUME CONTROL BY RECESS PROFILE CONTROL

(71) Applicant: Taiwan Semiconductor Manufacturing Co., Ltd., Hsin-Chu (TW)

(72) Inventors: Tung-Wen Cheng, New Taipei (TW); Che-Cheng Chang, New Taipei (TW); Mu-Tsang Lin, Hemei Township (TW); Bo-Feng Young, Taipei (TW); Cheng-Yen Yu, New Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days. days.

(21) Appl. No.: 14/854,772

(22) Filed: Sep. 15, 2015

(65) Prior Publication Data
US 2017/0077302 A1    Mar. 16, 2017

(51) Int. Cl.
*H01L 29/78* (2006.01)
*H01L 29/66* (2006.01)

(52) U.S. Cl.
CPC .... *H01L 29/7848* (2013.01); *H01L 29/66795* (2013.01); *H01L 29/785* (2013.01); *H01L 29/7851* (2013.01); *H01L 29/7854* (2013.01)

(58) Field of Classification Search
None
See application file for complete search history.

(56) References Cited

U.S. PATENT DOCUMENTS

| | | | | |
|---|---|---|---|---|
| 5,834,793 | A * | 11/1998 | Shibata | B82Y 10/00 257/25 |
| 6,037,605 | A * | 3/2000 | Yoshimura | H01L 29/0653 257/25 |
| 6,483,158 | B1 * | 11/2002 | Lee | H01L 29/0653 257/344 |
| 2014/0065782 | A1 * | 3/2014 | Lu | H01L 29/785 438/294 |

* cited by examiner

*Primary Examiner* — Daniel Whalen
(74) *Attorney, Agent, or Firm* — Eschweiler & Potashnik, LLC

(57) ABSTRACT

The present disclosure relates to a semiconductor device that controls a strain on a channel region by forming a dielectric material in recesses, adjacent to a channel region, in order to provide control over a volume and shape of a strain inducing material of epitaxial source/drain regions formed within the recesses. In some embodiments, the semiconductor device has epitaxial source/drain regions arranged in recesses within an upper surface of a semiconductor body on opposing sides of a channel region. A gate structure is arranged over the channel region, and a dielectric material is arranged laterally between the epitaxial source/drain regions and the channel region. The dielectric material consumes some volume of the recesses, thereby reducing a volume of strain inducing material in epitaxial source/drain regions formed in the recesses.

20 Claims, 6 Drawing Sheets

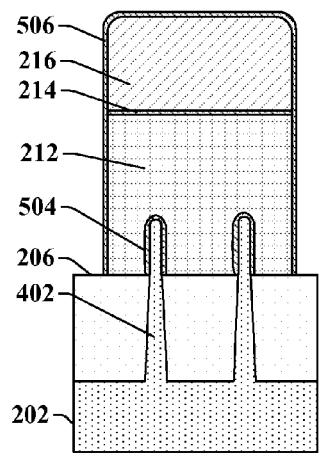
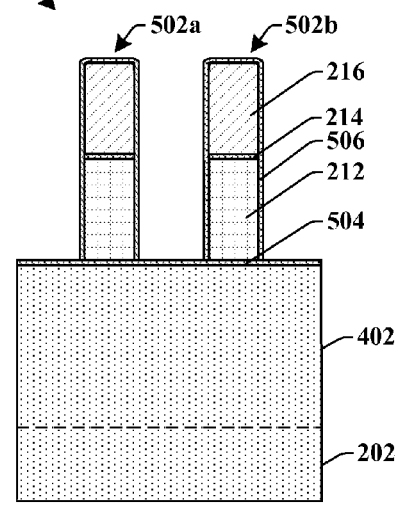
Fig. 5B    Fig. 5C
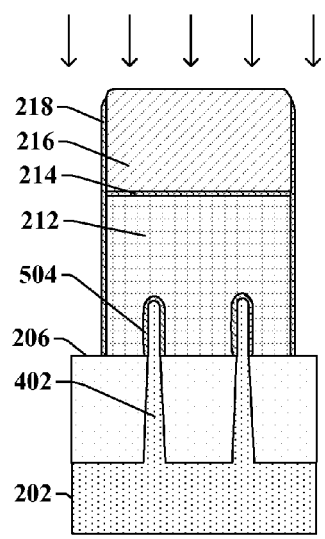
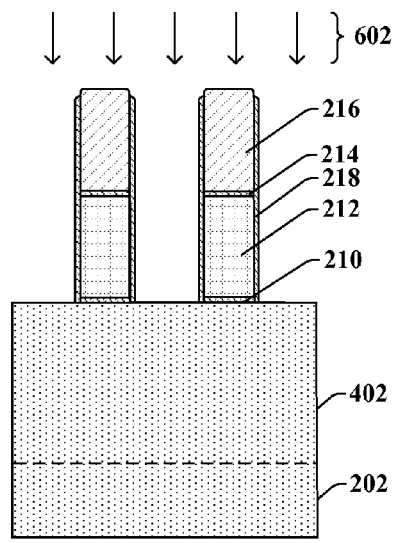
Fig. 6A    Fig. 6B

US 9,991,385 B2

ENHANCED VOLUME CONTROL BY RECESS PROFILE CONTROL

BACKGROUND

The cost and complexity associated with scaling of semiconductor device sizes according to Moore's law has given rise to new methods to improve semiconductor device characteristics. New gate materials such as Hi-K metal gates to decrease device leakage, finFET devices with increased effective gate area as compared to same-size planar devices, and strain inducing channels for increased charge carrier mobility are a few examples of methods to continue Moore's Law scaling for next generation microprocessor designs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4-10B different stages of manufacturing a finFET device, according to some embodiments of the present disclosure.

DETAILED DESCRIPTION

Figure 1:
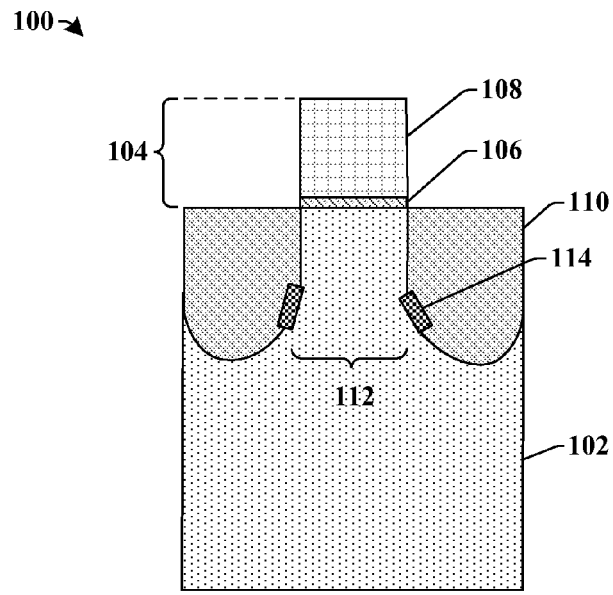
FIG. 1 illustrates some embodiments of a cross-sectional view of a semiconductor device having a dielectric material on sidewalls of recesses comprising epitaxial source/drain regions.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The semiconductor industry's drive for higher device densities, better device performance, and lower cost has led to the development of three-dimensional integrated circuit transistors that make greater use of space perpendicular to a substrate surface. One such transistor is a FinFET. A FinFET is a field effect transistor (FET) having a channel region formed in a fin-like structure of semiconductor material protruding outward from a substrate surface. This channel geometry allows the gate to wrap around multiple sides of the channel region. This improves control over the channel region and reduces short channel effects in comparison to a planar FET. The fin-like structure also allows the channel region to extend vertically, increasing its cross-sectional area and permitting a higher current without increasing the transistor's footprint.

Another method that permits a transistor to support a higher current without increasing its footprint is to induce strain in the channel region. Channel strain is typically induced by forming recesses adjacent to a channel region and epitaxially growing source and drain regions within the recesses having a semiconductor material with a lattice constant different from that of the channel region. For example, silicon-germanium (SiGe) has a larger lattice constant than silicon and can be grown in the trenches to induce compressive strain for silicon-based pMOS devices. SiP (silicon enriched with phosphorus) or SiC (silicon carbide) has a smaller lattice constant than silicon and can be grown in the trenches to induce tensile strain for silicon-based nMOS devices.

A volume and shape of the strain inducing material grown in such recesses are dependent on profiles of the recesses. Traditionally, a depth and shape of a recess formed in a silicon fin was controlled by the critical dimension and shape of the gate structures and nitride spacers disposed above the channel region. A change in epitaxial volume/shape of strain inducing material formed in such recesses changes an amount of strain induced by these layers on the channel region. For example, as the depth of the recesses increases, epitaxial volume of the strain inducing material increases and the strain on the channel region increases. Changing the strain on a channel region can change an amount of current associated with the device (e.g., saturation current ($I_{sat}$), on-current ($I_{on}$), off-current ($I_{off}$), etc.). Thus, controlling a volume and shape of the strain inducing material is critical in controlling device currents and total device performance.

Accordingly, the present disclosure relates to a method of controlling the strain on a channel region by forming a dielectric material in recesses, adjacent to a channel region, in order to provide control over a volume and shape of a strain inducing material of epitaxial source/drain regions formed within the recesses. In some embodiments, the method forms a dielectric film in recesses in a semiconductor substrate. An etch process is subsequently performed to remove the dielectric film from lower surfaces of the recesses, resulting in a dielectric material located along sidewalls of the recesses. Epitaxial source/drain regions are then formed by depositing a strain inducing material within the recesses at a location adjacent to the dielectric material. The strain inducing material is configured to induce a strain on a channel region between the epitaxial source/drain regions. The dielectric material consumes some volume of the recesses, thereby reducing a volume of strain inducing material in epitaxial source/drain regions formed in the recesses (e.g., a thicker and longer dielectric material will reduce a volume of the recess in which the strain inducing material can be formed, thereby decreasing a width and volume of the strain inducing material within the recesses). Furthermore, by positioning the dielectric material along the sidewall, the strain inducing material can be partially separated from the channel region, thereby further controlling strain on the channel region.

FIG. 1 illustrates some embodiments of a cross-sectional view of a semiconductor device 100 having a dielectric material on sidewalls of recesses comprising epitaxial source/drain regions.

The semiconductor device 100 comprises a semiconductor body 102. A gate structure 104 is arranged above the semiconductor body 102. The gate structure 104 includes a gate electrode 108 separated from the semiconductor body 102 by a gate dielectric 106. Epitaxial source/drain regions 110 are arranged within recesses extending into the semiconductor body 102 on opposing sides of the gate structure 104. A channel region 112 is arranged within the semiconductor body 102 at a location that is laterally between the epitaxial source/drain regions 110. The epitaxial source/drain regions 110 comprise a strain inducing material configured to induce a strain on the channel region 112. For example, in some embodiments, the epitaxial source/drain regions 110 comprise a different lattice constant than the semiconductor body 102. The difference in lattice constants induces a strain on the channel region 112.

A dielectric material 114 is arranged within the recesses in the semiconductor body 102. The dielectric material 114 abuts the strain inducing material of the epitaxial source/drain regions 110. In some embodiments, the dielectric material 114 may be located on sidewalls of the recesses at locations arranged laterally between the strain inducing material of the epitaxial source/drain regions 110 and the channel region 112. By forming the dielectric material 114 within recesses in which the epitaxial source/drain regions 110 are formed, a volume of the strain inducing material of the epitaxial source/drain regions 110 can be controlled. By controlling a volume of the strain inducing material, a strain on the channel region 112 can be controlled.

Figure 2A:
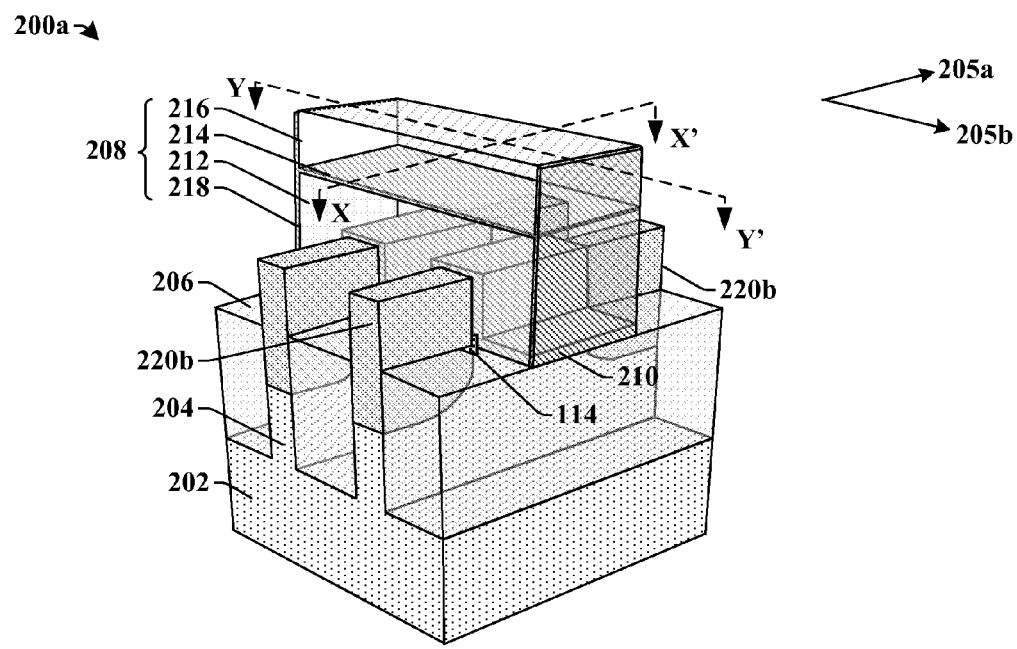
FIG. 2A illustrates a three-dimensional (3D) view of a semiconductor structure comprising finFET (fin field-effect transistor) devices, according to some embodiments of the present disclosure.
Figure 2B:
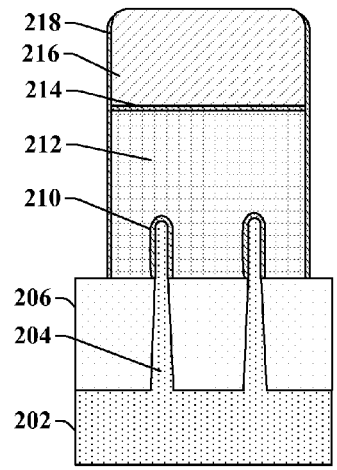
FIGS. 2B and 2C illustrate some embodiments of cross-sectional views taken along two perpendicular directions of FIG. 2A.
Figure 2C:
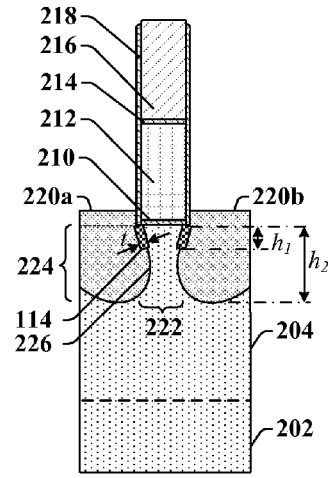

FIGS. 2A-2C illustrates some embodiments of a semiconductor structure comprising finFET (fin field-effect transistor) devices, according to some embodiments of the present disclosure.

FIG. 2A illustrates a three-dimensional (3D) view of a semiconductor structure 200a comprising finFET (fin field-effect transistor) devices, according to some embodiments of the present disclosure. Although the semiconductor structure 200a is illustrated as comprising a first two finFET devices, it will be appreciated that the semiconductor device may comprise more or less finFET devices. Furthermore, some layers of the semiconductor structure 200a are illustrated as transparent for easier illustration of inner layers.

The semiconductor structure 200a comprises one or more semiconductor fins 204. The one or more semiconductor fins 204 comprise three-dimensional fin of semiconductor material that protrude outward from a semiconductor substrate 202. In various embodiments, the one or more semiconductor fins 204 may comprise silicon, silicon-germanium, etc. In some embodiments, the one or more semiconductor fins 204 extend along a length (a longer dimension) in a first direction 205a and are separated in a second direction 205b, perpendicular to the first direction 205a, by isolation regions 206.

The one or more semiconductor fins 204 are straddled by the stacked gate structure 208 extending in the second direction 205b. The stacked gate structure 208 comprises a gate electrode 212 that straddles the one or more semiconductor fins 204. The gate electrode 212 is separated from the one or more semiconductor fins 204 by a gate dielectric layer 210. In various embodiments, the gate electrode 212 may comprise polysilicon or a metal (e.g., aluminum). The stacked gate structure 208 may further comprise a gate protection layer 214 arranged onto the gate electrode 212 and a hard mask layer 216 arranged onto the gate protection layer 214. In some embodiments, a sealant layer 218 is arranged along sidewalls of the gate electrode 212, the gate dielectric layer 210, the gate protection layer 214, and the hard mask layer 216. In some embodiments, gate dielectric layer 210, the gate protection layer 214, and the sealant layer 218 may comprise SiN (silicon nitride) or TiN (titanium nitride), for example. In some embodiments, the hard mask layer 216 comprises an oxide or SiN.

The one or more semiconductor fins 204 respectively comprise recesses having a first epitaxial source/drain region 220a and a second epitaxial source/drain region 220b arranged on opposing sides of the stacked gate structure 208. A channel region is arranged within the one or more semiconductor fins 204 between the first epitaxial source/drain region 220a and the second epitaxial source/drain region 220b at a location underlying the stacked gate structure 208. The first epitaxial source/drain region 220a and the second epitaxial source/drain region 220b comprise a strain inducing material configured to induce a strain on the channel region.

A dielectric material 114 is arranged within the recesses in the one or more semiconductor fins 204 at a position laterally between the strain inducing material of the epitaxial source/drain regions, 220a and 220b, and the channel region. In some embodiments, the dielectric material 114 may comprise an oxide (e.g., silicon oxide). In other embodiments, the dielectric material 114 may comprise a different dielectric material. In some embodiments, the dielectric material 114 is located at a location that is laterally aligned with an interface of the gate dielectric layer 210 and the isolation regions 206.

During device operation, a gate bias of greater than a threshold voltage ($V_T$) can be selectively applied to the gate electrode 212, which induces accumulation of charge or depletion in the channel region 222 under the gate electrode 212. While the gate bias is applied, a bias can be selectively applied across the source/drain regions, 220a and 220b, to cause current (i) to flow between source/drain regions, 220a and 220b,—a so called "on state". On the other hand, if the gate bias is less than $V_T$, then no current will flow between epitaxial source/drain, 220a and 220b, even if a suitable source/drain bias is applied—so called "off state" or sub-threshold state.

FIG. 2B illustrates a cross-sectional view 200b along Y-Y' (across the fin) of the semiconductor structure 200a. FIG. 2C illustrates a cross-sectional view 200c along X-X' (along the fin) of the semiconductor structure 200a. As shown in cross-sectional view 200c, the recesses 224 in the semiconductor fin 204 may comprise a rounded shape, in some embodiments. In some embodiments, the epitaxial source/drain regions 220 are confined to within the recesses 224. In other embodiments, the epitaxial source/drain regions 220 extend out of the recesses 224 to a location that is laterally separated from the gate electrode 212 by the sealant layer 218.

The dielectric material 114 may be located along sidewalls 226 of the recesses 224. Arranging the dielectric material 114 along the sidewalls 226 provides for separation between the strain inducing material of the epitaxial source/drain regions 220 and the channel region 222, thereby providing for additional control of strain on the channel region 222. In some embodiments, the dielectric material 114 may be located along a portion of the sidewalls 226. In some embodiments, the dielectric material 114 may be arranged along an upper portion of the sidewalls 226, so that a lower portion of the sidewalls 226 is in contact with the strain inducing material of the epitaxial source/drain regions 220. In some such embodiments, a part of the semiconductor fin 204 may overlie the dielectric material 114. In other embodiments (not shown), the dielectric material 114 may be arranged along an lower portion of the sidewalls 226, so that an overlying upper portion of the sidewalls 226 are in contact with the strain inducing material of the epitaxial source/drain regions 220.

In some embodiments, the dielectric material 114 has a height $h_1$ that is less than a height $h_2$ of the recesses 224 i.e., a height $h_2$ between a bottom surface of the stacked gate structure 208 and a bottom surface of the recesses 224). In some embodiments, the height $h_1$ of the dielectric material 114 may be equal to less than or equal to one-half of the height $h_2$ of the recesses 224. In some embodiments, the $h_2$ of the recesses 224 may be in a range of between approximately 20 nm and approximately 70 nm, while the height $h_1$ of the dielectric material 114 may be a range of between approximately 5 nm and approximately 10 nm. In some embodiments, a thickness t of the dielectric material 114 is in a range of between approximately 1 nm and approximately 3 nm. Advantageously, the thickness t and height $h_1$ of the dielectric material 114 can control the volume and shape of a strain inducing material within the recesses 224, thereby providing control over channel mobility and device currents.

Figure 3:
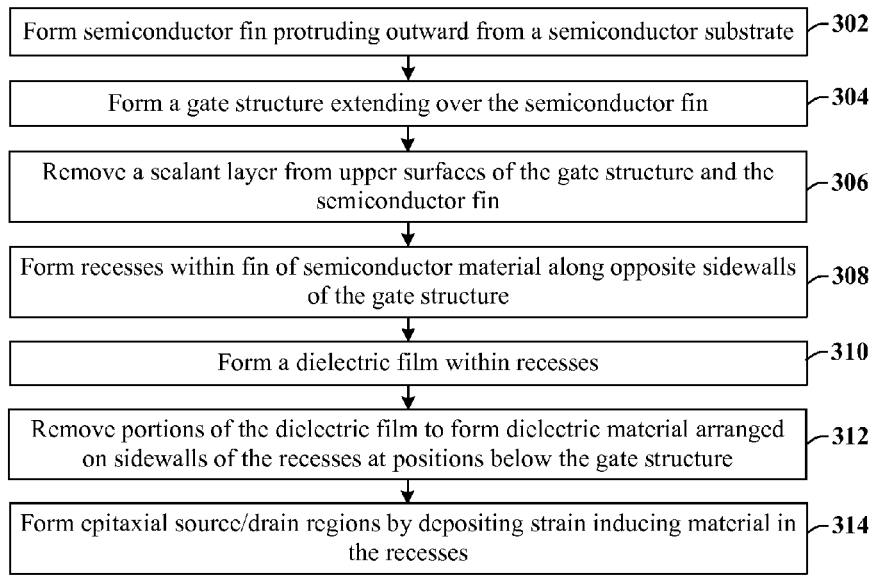
FIG. 3 illustrates a flowchart of some embodiments of a method for manufacturing a finFET device according to some embodiments of the present disclosure.

With reference to FIG. 3, a flowchart of some embodiments of a method 300 for manufacturing fin field-effect transistor (finFET) device is provided.

At 302, a semiconductor fin protruding outward form a semiconductor substrate is formed.

At 304, a gate structure extending over the semiconductor fin is formed.

At 306, a sealant layer may be removed from upper surfaces of the gate structure and the semiconductor fin.

At 308, recesses are formed within the semiconductor fin along opposite sidewalls of the gate structure.

At 310, a dielectric film is formed within the recesses.

At 312, portions of the dielectric film may be removed to form a dielectric material arranged on sidewalls of the recesses at positions below the gate structure.

At 314, epitaxial source/drain regions are formed by depositing a strain inducing material in the recesses.

While the disclosed method 300 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

FIGS. 4-10B illustrates some embodiments of a semiconductor substrate at different stages of manufacturing a finFET device, according to some embodiments of the present disclosure are provided. Although FIGS. 4-10B are described in relation to method 300, it will be appreciated that the structures disclosed in FIGS. 4-10B are not limited to such a method.

Figure 4:
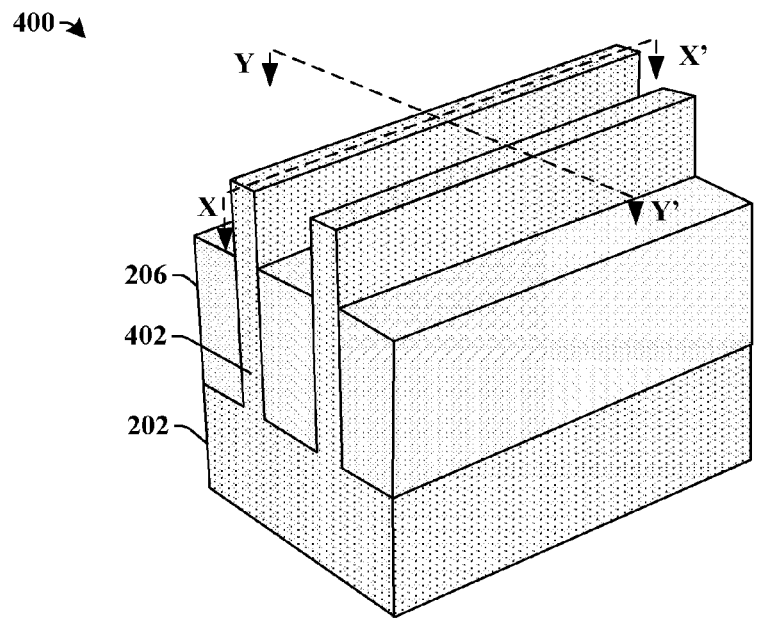

FIG. 4 illustrates some embodiments of a three-dimensional view 400 of a semiconductor structure corresponding to act 302.

As shown in three-dimensional view 400, one or more semiconductor fins 402 are formed protruding outward from a semiconductor substrate 202. In some embodiments, isolation regions 206 may be formed between adjacent semiconductor fins 402. The isolation regions 206 laterally separate the adjacent semiconductor fins 402. In some embodiments, the one or more semiconductor fins 402 may be formed by selectively etching a substrate to form one or more semiconductor fins 402 that extend outward from the semiconductor substrate 202. In other embodiments, the one or more semiconductor fins 402 may be formed by an epitaxial growth process.

In various embodiments, the semiconductor substrate 202 may be any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. In some embodiments, the one or more semiconductor fins 402 may comprise a semiconductor material such as silicon or silicon germanium, for example. In some embodiments, the isolation regions 206 comprise an oxide.

Figure 5A:
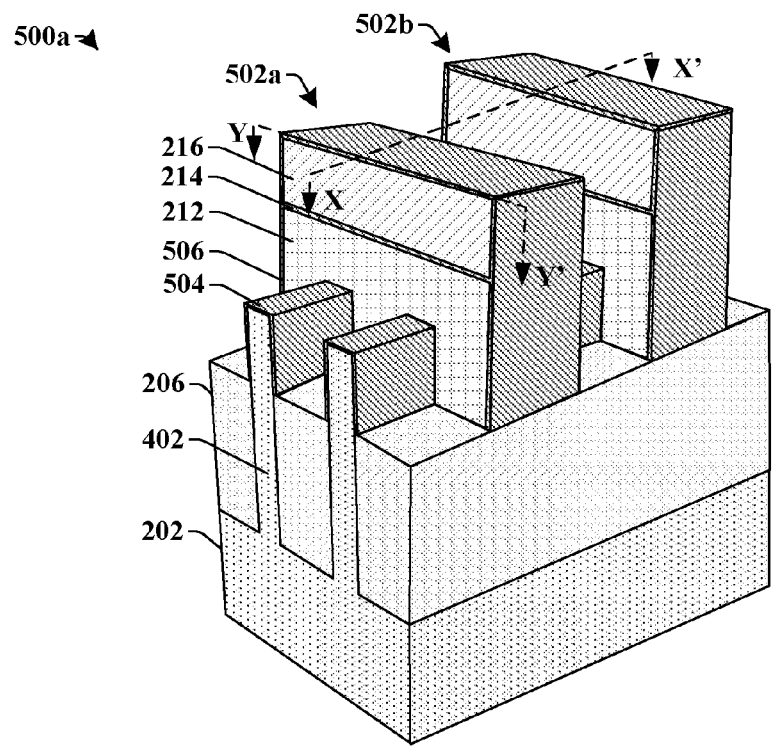

FIGS. 5A-5C illustrate some embodiments of a semiconductor structure corresponding to act 304.

With reference to FIG. 5A, a three-dimensional view 500a of some embodiments of a semiconductor structure is provided.

As illustrated in three-dimensional view 500a, a gate dielectric 504 is formed along sidewalls and upper surfaces of the semiconductor fin 204. In some embodiments, the gate dielectric 504 may comprise an oxide deposited by way of a deposition technique. In other embodiments, the gate dielectric 504 may comprise silicon nitride (SiN) or titanium nitride (TiN) deposited by way of a deposition technique (e.g., PVD, CVD, PECVD, etc.).

A gate electrode 212 is formed onto the gate dielectric 504. In some embodiments, the gate electrode 212 comprises polysilicon deposited by way of a deposition technique. In other embodiments, the gate electrode 212 comprises a metal, such as aluminum, for example. A gate protection layer 214 may be formed over the gate electrode 212. In some embodiments, the gate protection layer 214 comprises SiN or TiN. A hard mask layer 216 is formed above the gate protection layer 214. In some embodiments, the hard mask layer 216 may comprise an oxide formed by a deposition technique.

FIG. 5B illustrates a cross-sectional view 500b, along Y-Y' of FIG. 5A. FIG. 5C illustrates a cross-sectional view 500c, along X-X' of FIG. 5A. As shown in cross-sectional views 500b and 500c, the gate dielectric layer 210 covers sidewalls and an upper surface of the semiconductor fin 204. Further, a sealant layer 506 is formed onto sidewalls and an upper surface of gate structures, 502a and 502b. In various embodiments, the sealant layer 506 may comprise silicon nitride (SiN) or titanium nitride (TiN) formed by a deposition technique.

FIGS. 6A-6B illustrate some embodiments of a semiconductor structure corresponding to act 306.

FIG. 6A illustrates a cross-sectional view 600a along Y-Y' and FIG. 6B illustrates a cross-sectional view 600b along X-X'. As shown in cross-sectional views 600a and 600b, a first etch process is performed to expose the sealant layer to a first etchant 602. The first etchant 602 is configured to remove the sealant layer 218 from upper surfaces of the gate structures, 502a and 502b, so that an upper surface of the hard mask layer 216 is devoid of the sealant layer 218. In various embodiments, the first etchant 602 may comprise a dry etchant have an etching chemistry comprising a fluorine species (e.g., $CF_4$, $CHF_3$, $C_4F_8$, etc.) or a wet etchant (e.g., hydroflouric acid (HF)).

Figure 7:
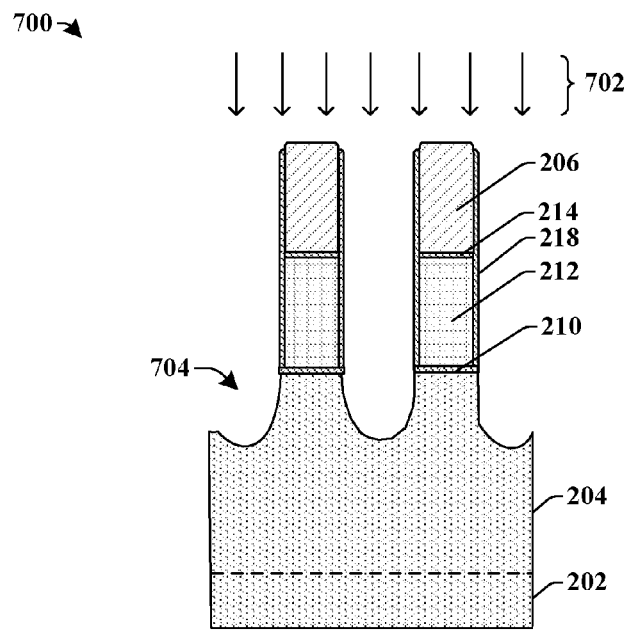

FIG. 7 illustrates some embodiments of a semiconductor structure corresponding to act 308, along a cross-sectional view 700 along Y-Y'.

As shown in cross-sectional view 700, a second etch process is performed to expose the semiconductor fins 204 to a second etchant 702 on opposing sides of the gate structures 502a and 502b. The second etchant 702 removes unmasked portions of the semiconductor fins 204 to form recesses 704 in the semiconductor fins 204. The recesses 704 extend from along upper surfaces of the semiconductor fins 204. In some embodiments, a depth of the recesses 704 ranges between approximately 20 nm and approximately 70 nm. In various embodiments, the second etchant 702 may comprise a dry etchant have an etching chemistry comprising a fluorine species (e.g., $CF_4$, $CHF_3$, $C_4F_8$, etc.) or a wet etchant (e.g., hydroflouric acid (HF)).

Figure 8A:
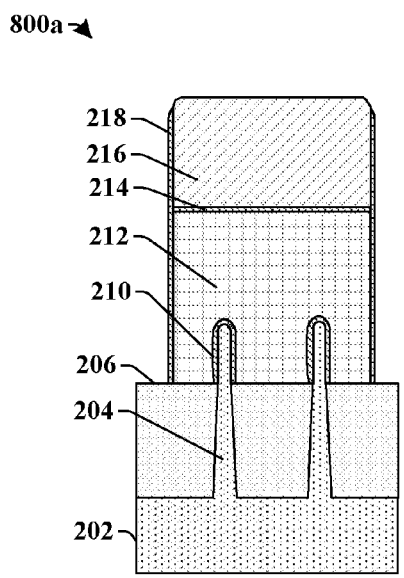
Figure 8B:
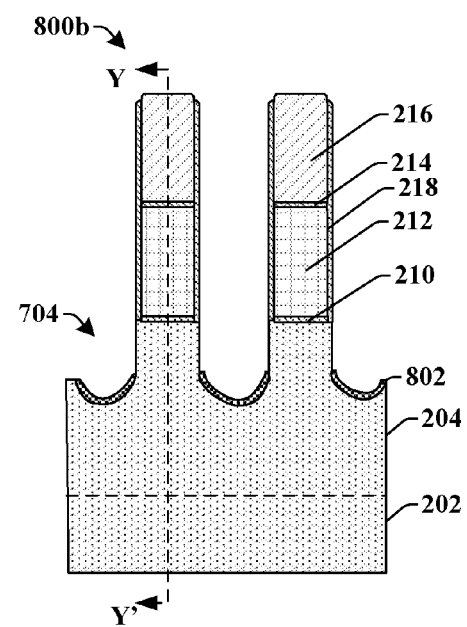

FIGS. 8A-8B illustrate some embodiments of cross-sectional views, 800a and 800b, of a semiconductor structure corresponding to act 310. Cross-sectional view 800a is along Y-Y' of cross-sectional view 800b.

As shown in cross-sectional view, 800a and 800b, a dielectric film 802 is formed within the recesses 704. The dielectric film 802 is formed onto sidewalls and lower surfaces of the recesses 704. In some embodiments, the dielectric film 802 comprises an oxide. In some embodiments, the dielectric film 802 can be formed by performing a thermal oxidation process. In another embodiment, the dielectric film 802 can be formed by a deposition process, such as an ALD process, for example.

Figure 9A:
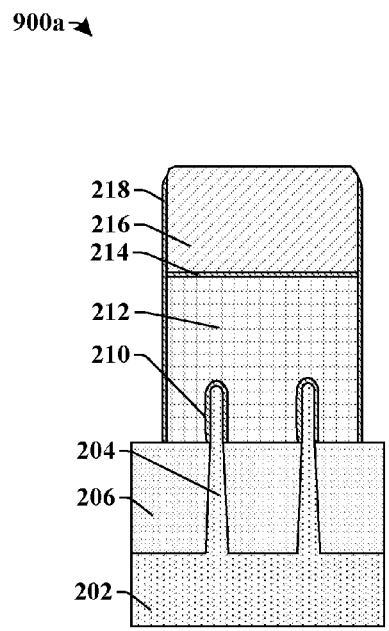
Figure 9B:
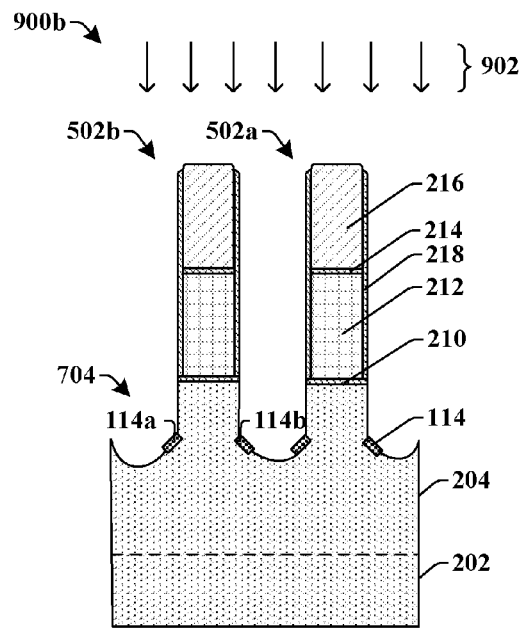

FIGS. 9A-9B illustrate some embodiments of a semiconductor structure corresponding to act 312.

FIG. 9A illustrates a cross-sectional view 900a along Y-Y', and FIG. 9B illustrates a cross-sectional view 900b along X-X'. As shown in cross-sectional views 900a and 900b, a third etch process is performed to expose the dielectric film 802 to a third etchant 902. The third etchant 902 is configured remove portions of the dielectric film 802 from the recesses 704. In some embodiments, the third etchant 902 removes the dielectric film from lower surfaces and part of sidewalls of the recesses so as to form a dielectric material 114 arranged on sidewalls of the recesses 704 at positions below the gate structures 506a and 506b. In some embodiments, the dielectric material 114 comprises a first section 114a arranged along a first sidewall of the recesses and a second section 114b arranged along an opposite second sidewall of the recesses, wherein the first section 114a is laterally separated from the second section 114b. In some embodiments, the dielectric material 114 comprises silicon oxide.

In some embodiments, the third etchant 902 comprises a dry etchant (e.g. an RIE etchant, a plasma etchant, etc.). In other embodiments, the third etchant 902 may comprise ions, which are accelerated toward the dielectric film 802 using an electric field generated by applying a bias voltage greater than approximately 100 V to the semiconductor substrate 202. In yet other embodiments, one or more photolithography processes are used to form masking elements such that the remaining regions of the dielectric film 802 and the semiconductor substrate 202 are protected from the third etchant 902.

Figure 10A:
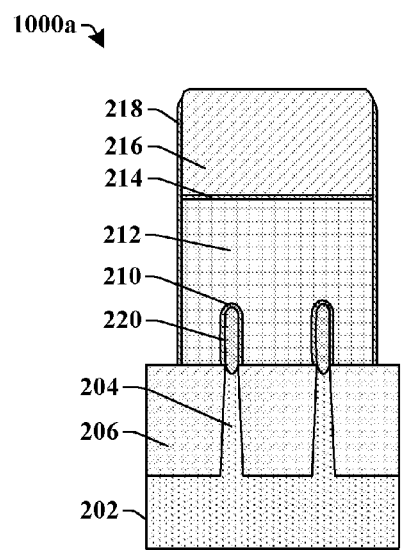
Figure 10B:
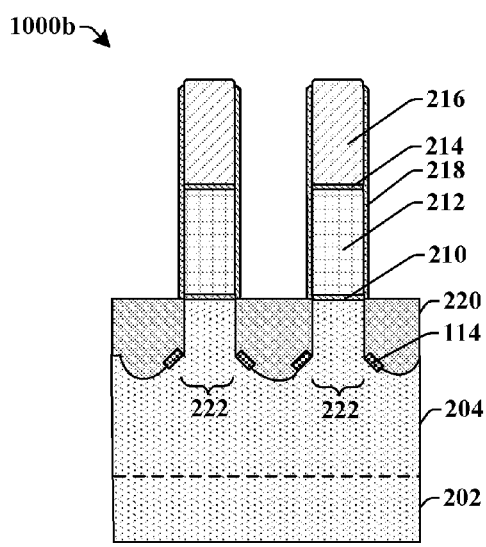

FIGS. 10A-10B illustrate some embodiments of a semiconductor structure corresponding to act 314.

FIG. 10A illustrates a cross-sectional view 1000a along Y-Y', and FIG. 10B illustrates a cross-sectional view 1000b along X-X'. As shown in cross-sectional views, 1000a and 1000b, epitaxial source/drain regions 220 are formed within the recesses. The epitaxial source/drain regions 220 comprise a strain inducing material configured to induce a strain on channel regions 222 laterally arranged between the epitaxial source/drain regions 220. In some embodiments (not shown), the strain inducing material within the epitaxial source/drain regions 220 abut sidewalls of the gate structures, 506a and 506b. In some embodiments, the strain inducing material is grown epitaxially, and comprises germanium (Ge) or silicon-germanium (SiGe). In other embodiments, the strain inducing material may comprise carbon doped silicon or other strain inducing materials.

Thus, the present disclosure relates to a transistor device having a dielectric material configured to control strain within a channel region, which is located within recesses in a semiconductor substrate comprising epitaxial source/drain regions.

In some embodiments, the present disclosure relates to a semiconductor device. The semiconductor device comprises epitaxial source/drain regions arranged in recesses within an upper surface of a semiconductor body on opposing sides of a channel region. A gate structure is arranged onto the semiconductor body over the channel region. A dielectric material is arranged laterally between the epitaxial source/drain regions and the channel region.

In other embodiments, the present disclosure relates to a semiconductor device comprising, a three-dimensional fin of semiconductor material extending outward from a substrate and having a channel region. Shallow trench isolation (STI) regions are disposed on opposing sides of the three-dimensional fin of semiconductor material. A gate structure is arranged over the three-dimensional fin of semiconductor material and the STI regions, wherein the three-dimensional fin of semiconductor material comprises recesses extending below a lower surface of the gate structure on opposing sides of the gate structure. An oxide material comprising a first section is arranged along a first sidewall of the recesses and a second section is arranged along an opposite second sidewall of the recesses, wherein the first section is laterally separated from the second section.

In yet other embodiments, the present disclosure relates to a method of forming a fin field-effect transistor (finFET) device. The method comprises forming a fin of semiconductor material protruding outward from a semiconductor substrate. A gate structure extending over the fin of semiconductor material is also formed. Following that, recesses are formed within the fin of semiconductor material that extend along opposing sidewalls of the gate structure. Subsequently, a dielectric film is formed within the recesses. Following that, portions of the dielectric film is etched to form a dielectric material arranged on sidewalls of the recesses at positions below the gate structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a three-dimensional fin of semiconductor material extending outward from a substrate and having a channel region;
   shallow trench isolation (STI) regions disposed on opposing sides of the three-dimensional fin of semiconductor material;
   epitaxial source/drain regions arranged in recesses within an upper surface of the three-dimensional fin on opposing sides of the channel region;
   a gate structure arranged onto the three-dimensional fin, wherein the gate structure is over and along sides of the three-dimensional fin;
   a dielectric material arranged laterally between the epitaxial source/drain regions and the channel region and having top surfaces recessed vertically below top surfaces of the epitaxial source/drain regions and bottom surfaces above bottommost points of the recesses; and
   wherein the dielectric material has a bottommost surface below uppermost surfaces of the STI regions and an uppermost surface above the uppermost surfaces of the STI regions.

2. The semiconductor device of claim 1, wherein the gate structure straddles the three-dimensional fin of semiconductor material.

3. The semiconductor device of claim 2, wherein the gate structure comprises:
   a gate electrode disposed over a gate dielectric layer;
   a gate protection layer disposed over the gate electrode; and
   a hard mask disposed over the gate protection layer.

4. The semiconductor device of claim 3, further comprising:
   a sealant layer disposed along sidewalls of the gate electrode, sidewalls of the gate dielectric layer, and sidewalls of the hard mask, wherein the dielectric material abuts the sealant layer; and
   wherein the gate protection layer comprises a dielectric having a lower surface contacting the gate electrode and an upper surface contacting the hard mask.

5. The semiconductor device of claim 1, wherein the dielectric material comprises silicon oxide.

6. The semiconductor device of claim 1, wherein the epitaxial source/drain regions contact the three-dimensional fin of semiconductor material along bottom surfaces of the recesses.

7. The semiconductor device of claim 1, wherein the dielectric material comprises a first section arranged along a first sidewall of the recesses and a second section arranged along an opposite second sidewall of the recesses, wherein the first section is laterally separated from the second section.

8. The semiconductor device of claim 1, wherein the dielectric material has a height that is less than or equal to one-half of the height of the recesses.

9. The semiconductor device of claim 1, wherein the dielectric material is vertically separated from bottom surfaces of the recesses.

10. A FinFET device, comprising:
    a three-dimensional fin of semiconductor material extending outward from a substrate and having a channel region;
    shallow trench isolation (STI) regions disposed on opposing sides of the three-dimensional fin of semiconductor material;
    a gate structure arranged over the three-dimensional fin of semiconductor material and the STI regions, wherein the three-dimensional fin of semiconductor material comprises recesses extending below a lower surface of the gate structure on opposing sides of the gate structure;
    epitaxial source/drain regions arranged within the recesses;
    an oxide material comprising a first section arranged along a first sidewall of the recesses and a second section arranged along an opposite second sidewall of the recesses, wherein the first section is laterally separated from the second section; and
    wherein the oxide material has a bottommost surface below uppermost surfaces of the STI regions and an uppermost surface above the uppermost surfaces of the STI regions.

11. The FinFET device of claim 10, further comprising:
    a strain inducing material disposed within the recesses, wherein the oxide material is arranged laterally between the strain inducing material and the three-dimensional fin of semiconductor material.

12. The FinFET device of claim 10, wherein the oxide material is vertically separated from a bottom surface of the recesses.

13. The FinFET device of claim 10, wherein the uppermost surface of the oxide material is recessed below a top surface of the three-dimensional fin of semiconductor material.

14. The FinFET device of claim 10, wherein the oxide material vertically separates the semiconductor material within the three-dimensional fin of semiconductor material and the recesses along a line that is normal to an uppermost surface of the substrate.

15. The FinFET device of claim 10,
    wherein the oxide material has a height that is in a first range of between approximately 5 nm and approximately 10 nm; and
    wherein the recesses have a second height that is in a second range of between approximately 20 nm and approximately 70 nm.

16. A semiconductor device, comprising:
    a three-dimensional fin of semiconductor material extending outward from a substrate;
    shallow trench isolation (STI) regions disposed on opposing sides of the three-dimensional fin of semiconductor material along a first direction;
    a gate structure arranged over a channel region within the three-dimensional fin of semiconductor material;
    epitaxial source/drain regions arranged in a first recess and a second recess within the three-dimensional fin of semiconductor material, wherein the first recess and the second recess are located on opposing sides of the channel region along a second direction perpendicular to the first direction;
    a dielectric material laterally between the epitaxial source/drain regions and the channel region, wherein the dielectric material comprises a first section arranged along a first sidewall of the first recess and a second section discontinuous with the first section and arranged along a second sidewall of the first recess;

wherein the dielectric material has top surfaces that are recessed below a top surface of the three-dimensional fin of semiconductor material and bottom surfaces above bottommost points of the first recess and the second recess; and wherein the dielectric material has a bottommost surface below uppermost surfaces of the STI regions and an uppermost surface above the uppermost surfaces of the STI regions.

17. The semiconductor device of claim 16, wherein the first sidewall of the first recess and the second sidewall of the first recess extend beyond the uppermost surface and the bottommost surface of the dielectric material.

18. The semiconductor device of claim 16, wherein the epitaxial source/drain regions separate the dielectric material from bottom surfaces of the first recess and the second recess.

19. The semiconductor device of claim 16, wherein the first section of the dielectric material and the second section of the dielectric material vertically overlap a bottom surface of the gate structure.

20. The semiconductor device of claim 16, wherein the first section of the dielectric material and the second section of the dielectric material have a height that is smaller than a depth of the first recess.

* * * * *